United States Patent
Bang et al.

(10) Patent No.: US 11,524,315 B2
(45) Date of Patent: Dec. 13, 2022

(54) SUPPORT UNIT, SUBSTRATE TREATING APPARATUS INCLUDING THE SAME, AND SUBSTRATE TREATING METHOD USING THE SUBSTRATE TREATING APPARATUS

(71) Applicant: SEMES CO., LTD., Cheonan-si (KR)

(72) Inventors: Jaeoh Bang, Seoul (KR); Kyungjin Seo, Asan-si (KR); Youngseo An, Osan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 17/085,691

(22) Filed: Oct. 30, 2020

(65) Prior Publication Data
US 2021/0129175 A1 May 6, 2021

(30) Foreign Application Priority Data
Oct. 31, 2019 (KR) .................. 10-2019-0138105

(51) Int. Cl.
*B05C 13/00* (2006.01)
*B05C 5/02* (2006.01)

(52) U.S. Cl.
CPC ............... *B05C 13/00* (2013.01); *B05C 5/02* (2013.01)

(58) Field of Classification Search
None
See application file for complete search history.

(56) References Cited

U.S. PATENT DOCUMENTS

| 2004/0149227 A1* | 8/2004 | Saito ............ C23C 16/4411 118/728 |
| 2005/0011441 A1* | 1/2005 | Kannan ............ C23C 16/46 118/715 |
| 2008/0190364 A1* | 8/2008 | Mahon ............ H01L 21/6831 134/1.1 |

FOREIGN PATENT DOCUMENTS

| JP | 2008-311622 A | 12/2008 |
| JP | 2008-311624 A | 12/2008 |
| JP | 2011-253899 A | 12/2011 |
| JP | 2012-84755 A | 4/2012 |
| JP | 2012-99787 A | 5/2012 |
| JP | 2013-48144 A | 3/2013 |
| JP | 2016-46515 A | 4/2016 |
| JP | 2018-37469 A | 3/2018 |
| KR | 10-2006-0010605 A | 2/2006 |
| KR | 100822372 B1 | 4/2008 |
| KR | 10-2009-0088808 A | 8/2009 |
| KR | 10-2016-0023562 A | 3/2016 |
| KR | 2018-0021263 A | 3/2018 |

(Continued)

*Primary Examiner* — Jethro M. Pence
(74) *Attorney, Agent, or Firm* — Harness, Dickey & Pierce, P.L.C.

(57) ABSTRACT

An apparatus for treating a substrate includes a housing having a treatment space inside, a gas supply unit that supplies a hydrophobic gas into the treatment space to hydrophobicize the substrate, and a support unit that supports the substrate in the treatment space. The support unit includes a support plate, a heating member that heats the substrate placed on the support plate, and a height adjustment member that changes a position of the substrate between a first position spaced apart upward from an upper surface of the support plate by a first distance and a second position spaced apart upward from the upper surface of the support plate by a second distance, and the second position is a higher position than the first position.

15 Claims, 13 Drawing Sheets

(56) References Cited

FOREIGN PATENT DOCUMENTS

| KR | 2019-0080326 A | * | 7/2019 | ....... H01L 21/67098 |
| KR | 2019-0080326 A | | 7/2019 | |

* cited by examiner

SUPPORT UNIT, SUBSTRATE TREATING APPARATUS INCLUDING THE SAME, AND SUBSTRATE TREATING METHOD USING THE SUBSTRATE TREATING APPARATUS

CROSS-REFERENCE TO RELATED APPLICATIONS

A claim for priority under 35 U.S.C. § 119 is made to Korean Patent Application No. 10-2019-0138105 filed on Oct. 31, 2019, in the Korean Intellectual Property Office, the entire contents of which are hereby incorporated by reference.

BACKGROUND

Embodiments of the inventive concept described herein relate to a support unit, a substrate treating apparatus including the support unit, and a substrate treating method using the substrate treating apparatus.

In general, various processes, such as cleaning, deposition, photolithography, etching, ion implantation, and the like, are performed to manufacture semiconductor devices. The photolithography process is a process of forming a desired pattern on a substrate. The photolithography process is usually performed in spinner local equipment to which exposing equipment is connected and that continuously performs a coating process, an exposing process, and a developing process.

The spinner equipment sequentially or selectively performs a hexamethyldisilazane (hereinafter, referred to as HMDS) process, a coating process, a bake process, and a developing process.

The HMDS process is a process of hydrophobicizing a substrate by dispensing an HMDS gas onto the substrate before application of photo-resist (PR) so as to improve efficiency in adhesion of the photo-resist to the substrate. The bake process is a process of heating and cooling the substrate to strengthen the photo-resist film formed on the substrate or to adjust the temperature of the substrate to a predetermined temperature.

In a conventional hydrophobization process, only an upper surface of a substrate is hydrophobicized. However, in the case where both surfaces of the substrate are not hydrophobicized, there is a problem of a stain on the substrate in some processes such as a wet etching process in which the substrate is dipped into an etching liquid. Accordingly, the upper and lower surfaces of the substrate need to be hydrophobicized.

In a case of hydrophobicizing the lower surface of the substrate raised by lift pins, a so-called squeeze effect by which the substrate is downwardly forced occurs. Therefore, the substrate, when raised, bounces up and is damaged.

SUMMARY

Embodiments of the inventive concept provide a support unit for hydrophobicizing an upper surface and a lower surface of a substrate, a substrate treating apparatus including the support unit, and a substrate treating method using the substrate treating apparatus.

Furthermore, embodiments of the inventive concept provide a support unit for minimizing a squeeze effect occurring while a substrate is subjected to heat treatment, a substrate treating apparatus including the support unit, and a substrate treating method using the substrate treating apparatus.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a housing having a treatment space inside, a gas supply unit that supplies a hydrophobic gas into the treatment space to hydrophobicize the substrate, and a support unit that supports the substrate in the treatment space. The support unit includes a support plate, a heating member that heats the substrate placed on the support plate, and a height adjustment member that changes a position of the substrate between a first position spaced apart upward from an upper surface of the support plate by a first distance and a second position spaced apart upward from the upper surface of the support plate by a second distance, and the second position is a higher position than the first position.

According to an embodiment, the height adjustment member may include a plunger that is movable in an up-down direction between a protruding position and an insertion position and that supports the substrate in the protruding position. The insertion position may be a height equal to or lower than the first position, and the protruding position may be a height corresponding to the second position.

According to an embodiment, the height adjustment member may further include a proximity pin having an upper end at the first distance from the upper surface of the support plate.

According to an embodiment, the proximity pin may be fixed to the support unit.

According to an embodiment, the plunger may be located in a recess formed on the upper surface of the support plate, and a pressure-reducing passage that reduces pressure in the recess may be connected to the recess.

According to an embodiment, the plunger may be moved from the second position to the first position as pressure in the pressure-reducing passage is reduced.

According to an embodiment, the plunger may have a through-hole vertically formed through the plunger, and the through-hole may be connected with the pressure-reducing passage.

According to an embodiment, the plunger may include a first body and a second body extending upward from the first body, and the second body may have a smaller area than the first body when viewed from above. In the protruding position, the first body may be located in the recess, and in the protruding position, the second body may support the substrate.

According to an embodiment, an elastic member may be provided on a lower surface of the first body. One side of the elastic member may be connected with the lower surface of the first body, and an opposite side of the elastic member may be connected with the support plate.

According to an embodiment, the pressure-reducing passage may include a main passage and a first passage and a second passage that branch off from the main passage. The first passage may be connected with the recess, and the second passage may extend to the upper surface of the support plate.

According to an embodiment, the plunger may include a plurality of plungers arranged in a circumferential direction of the support plate.

According to an embodiment, the hydrophobic gas may be a hexamethyldisilazane (HMDS) gas.

According to an exemplary embodiment, a support unit for supporting a substrate includes a support plate, a heating member that heats the substrate placed on the support plate, and a height adjustment member that changes a position of the substrate between a first position spaced apart upward from an upper surface of the support plate by a first distance and a second position spaced apart upward from the upper surface of the support plate by a second distance, and the second distance is greater than the first distance.

According to an embodiment, the height adjustment member may include a plunger that supports the substrate in the second position, and the plunger may be movable between the first position and the second position.

According to an embodiment, the height adjustment member may include a proximity pin having an upper end at the first distance from the upper surface of the support plate.

According to an embodiment, the proximity pin may be fixed to the support unit.

According to an embodiment, the plunger may be located in a recess formed on the upper surface of the support plate, the recess may be connected with a pressure-reducing passage formed inside the support plate, and the plunger may be moved from the second position to the first position as pressure in the pressure-reducing passage is reduced.

According to an embodiment, an elastic member may be provided on a lower surface of the plunger. One side of the elastic member may be connected with the lower surface of the plunger, and an opposite side of the elastic member may be connected with the support plate.

According to an exemplary embodiment, a method for treating a substrate includes hydrophobicizing a surface of the substrate by supplying the hydrophobic gas into the treatment space, in which one of an upper surface and a lower surface of the substrate is hydrophobicized in a state in which the substrate is located in one of the first position and the second position, and thereafter the other surface of the substrate is hydrophobicized in a state in which the substrate is located in the other position.

According to an embodiment, the height adjustment member may include a plunger located in a recess formed on the support plate, and the plunger may be moved between a protruding position and an insertion position to adjust a height of the substrate between the first position and the second position.

According to an embodiment, a movement of the plunger from the second position to the first position may be performed by lowering the plunger by reducing pressure in the recess formed on the support plate, and a movement of the plunger from the first position to the second position may be performed by raising the plunger by stopping applying reduced pressure to the recess.

According to an embodiment, the plunger may be raised by elasticity of an elastic member connected to the plunger.

According to an embodiment, the height adjustment member may include a proximity pin provided on the upper surface of the support plate, and the first position may be a position corresponding to an upper end of the proximity pin.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
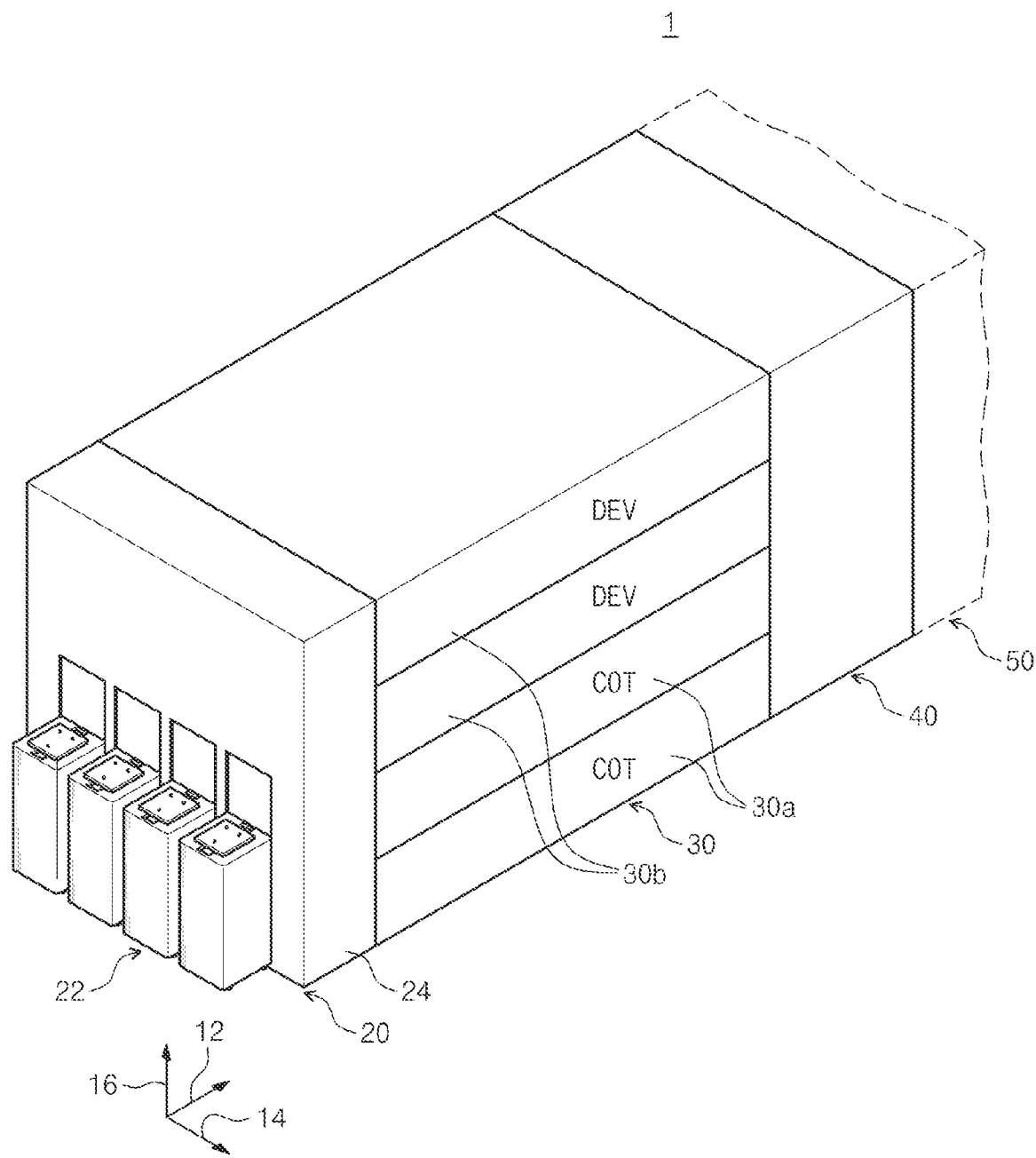
FIG. 1 is a schematic perspective view illustrating a substrate treating apparatus of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Figure 2:
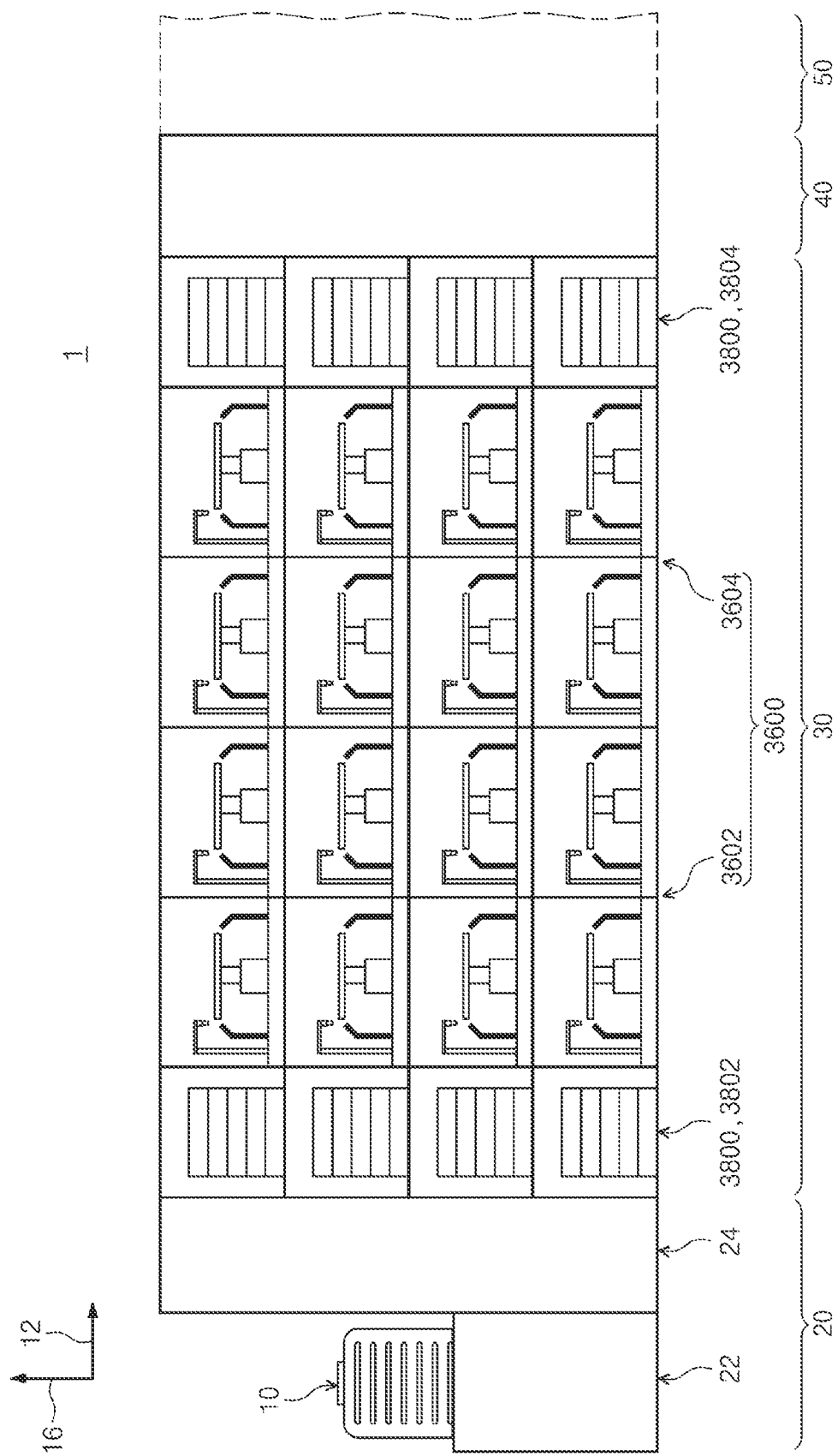
FIG. 2 is a sectional view illustrating coating blocks and developing blocks of the substrate treating apparatus of FIG. 1.
Figure 3:
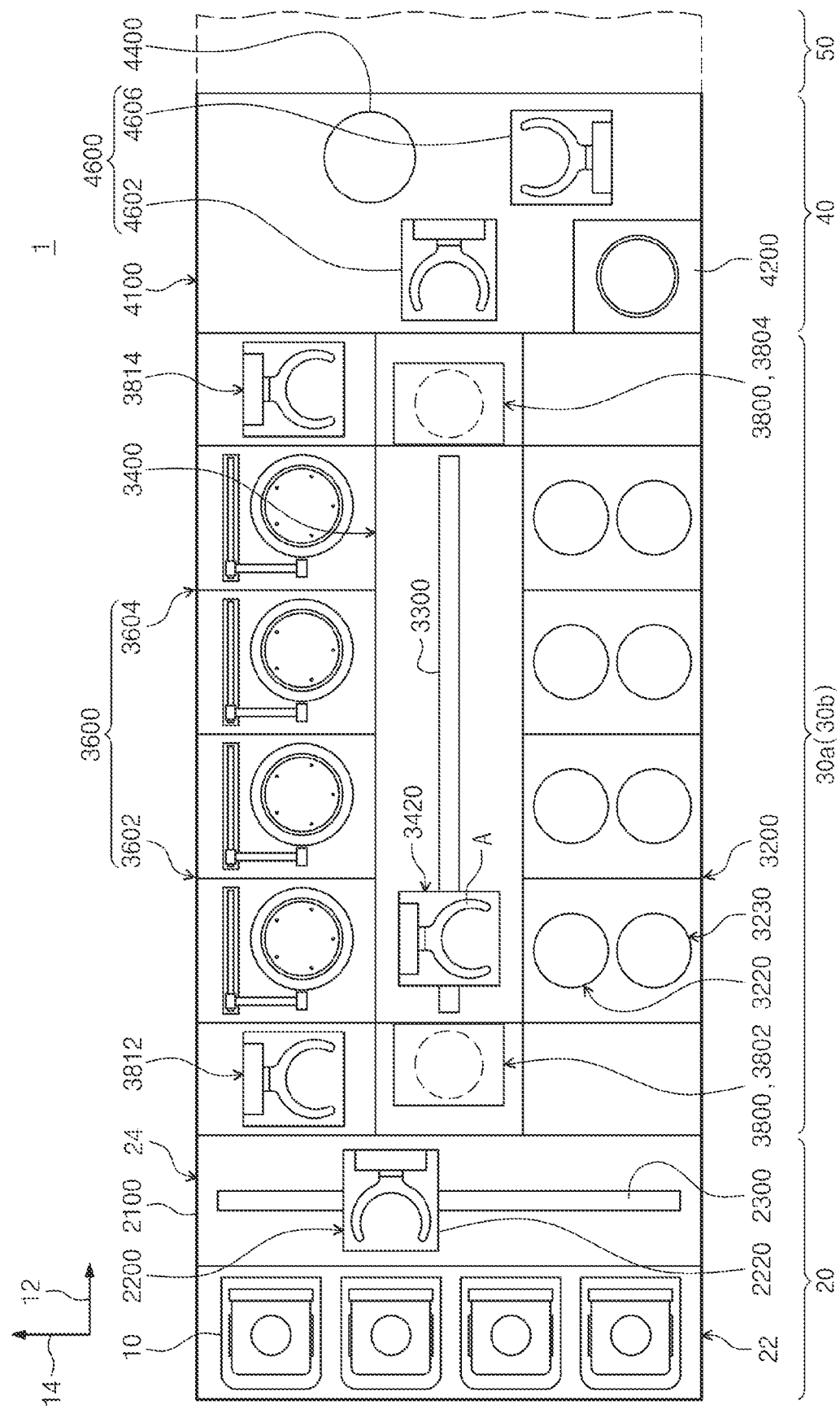
FIG. 3 is a plan view illustrating the substrate treating apparatus of FIG. 1.

FIG. 1 is a schematic perspective view illustrating a substrate treating apparatus of the inventive concept. FIG. 2 is a sectional view illustrating coating blocks and developing blocks of the substrate treating apparatus of FIG. 1. FIG. 3 is a plan view illustrating the substrate treating apparatus of FIG. 1.

Referring to FIGS. 1 to 3, the substrate treating apparatus 1 includes an index module 20, a treating module 30, and an interface module 40. According to an embodiment, the index module 20, the treating module 30, and the interface module 40 are sequentially disposed in a row. Hereinafter, a direction in which the index module 20, the treating module 30, and the interface module 40 are arranged is referred to as an X-axis direction 12, a direction perpendicular to the X-axis direction 12 when viewed from above is referred to as a Y-axis direction 14, and a direction perpendicular to the X-axis direction 12 and the Y-axis direction 14 is referred to as a Z-axis direction 16.

The index module 20 transfers substrates W from carriers 10 having the substrates W received therein to the treating module 30 and places the completely treated substrates W in the carriers 10. The lengthwise direction of the index module 20 is parallel to the Y-axis direction 14. The index module 20 has load ports 22 and an index frame 24. The load ports 22 are located on the opposite side to the treating module 30 with respect to the index frame 24. The carriers 10, each of which has the substrates W received therein, are placed on the load ports 22. The load ports 22 may be disposed along the Y-axis direction 14.

Airtight carriers 10 such as front open unified pods (FOUPs) may be used as the carriers 10. The carriers 10 may be placed on the load ports 22 by a transfer unit (not illustrated) such as an overhead transfer, an overhead conveyor, or an automatic guided vehicle, or by an operator.

An index robot 2200 is provided in the index frame 24. A guide rail 2300, the lengthwise direction of which is parallel to the Y-axis direction 14, is provided in the index frame 24. The index robot 2200 is movable on the guide rail 2300. The index robot 2200 includes a hand 2220 on which the substrate W is placed, and the hand 2220 is movable forward and backward, rotatable about an axis facing in the Z-axis direction 16, and movable along the Z-axis direction 16.

The treating module 30 performs a coating process and a developing process on the substrates W. The treating module 30 has the coating blocks 30*a* and the developing blocks 30*b*. The coating blocks 30*a* perform the coating process on the substrates W, and the developing blocks 30*b* perform the developing process on the substrates W. The coating blocks 30*a* are stacked on each other. The developing blocks 30*b* are stacked on each other. According to the embodiment of FIG. 2, two coating blocks 30*a* and two developing block 30*b* are provided. The coating blocks 30*a* may be disposed under the developing blocks 30*b*. According to an embodiment, the two coating blocks 30*a* may perform the same process and may have the same structure. Furthermore, the two developing blocks 30*b* may perform the same process and may have the same structure.

Referring to FIG. 3, each of the coating blocks 30*a* has heat treatment chambers 3200, a transfer chamber 3400, liquid treatment chambers 3600, and buffer chambers 3800. Each of the heat treatment chambers 3200 performs a heat treatment process on the substrate W. The heat treatment process may include a cooling process and a heating process. Each of the liquid treatment chambers 3600 forms a liquid film on the substrate W by dispensing a liquid onto the substrate W. The liquid film may be a photoresist film or an anti-reflection film. The transfer chamber 3400 transfers the substrate W between the heat treatment chamber 3200 and the liquid treatment chamber 3600 in the coating block 30*a*.

The transfer chamber 3400 is disposed such that the lengthwise direction thereof is parallel to the X-axis direction 12. A transfer unit 3420 is provided in the transfer chamber 3400. The transfer unit 3420 transfers the substrate W between the heat treatment chamber 3200, the liquid treatment chamber 3600, and the buffer chambers 3800. According to an embodiment, the transfer unit 3420 has a hand A on which the substrate W is placed, and the hand A is movable forward and backward, rotatable about an axis facing in the Z-axis direction 16, and movable along the Z-axis direction 16. A guide rail 3300, the lengthwise direction of which is parallel to the X-axis direction 12, is provided in the transfer chamber 3400. The transfer unit 3420 is movable on the guide rail 3300.

Figure 4:
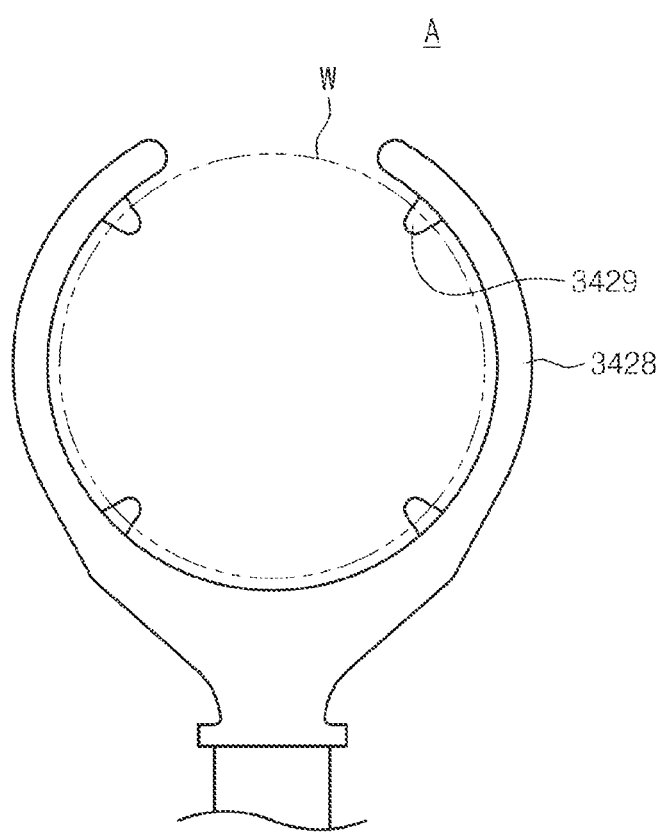
FIG. 4 is a view illustrating a hand of a transfer unit of FIG. 3.

FIG. 4 is a view illustrating one example of the hand of the transfer unit of FIG. 3. Referring to FIG. 4, the hand A has a base 3428 and support protrusions 3429. The base 3428 may have an annular ring shape, the circumference of which is partly curved. The base 3428 has an inner diameter greater than the diameter of the substrate W. The support protrusions 3429 extend inward from the base 3428. The support protrusions 3429 support an edge region of the substrate W. According to an embodiment, four support protrusions 3429 may be provided at equal intervals.

Referring again to FIGS. 2 and 3, the heat treatment chambers 3200 are arranged along the X-axis direction 12. The heat treatment chambers 3200 are located on one side of the transfer chamber 3400.

Figure 5:
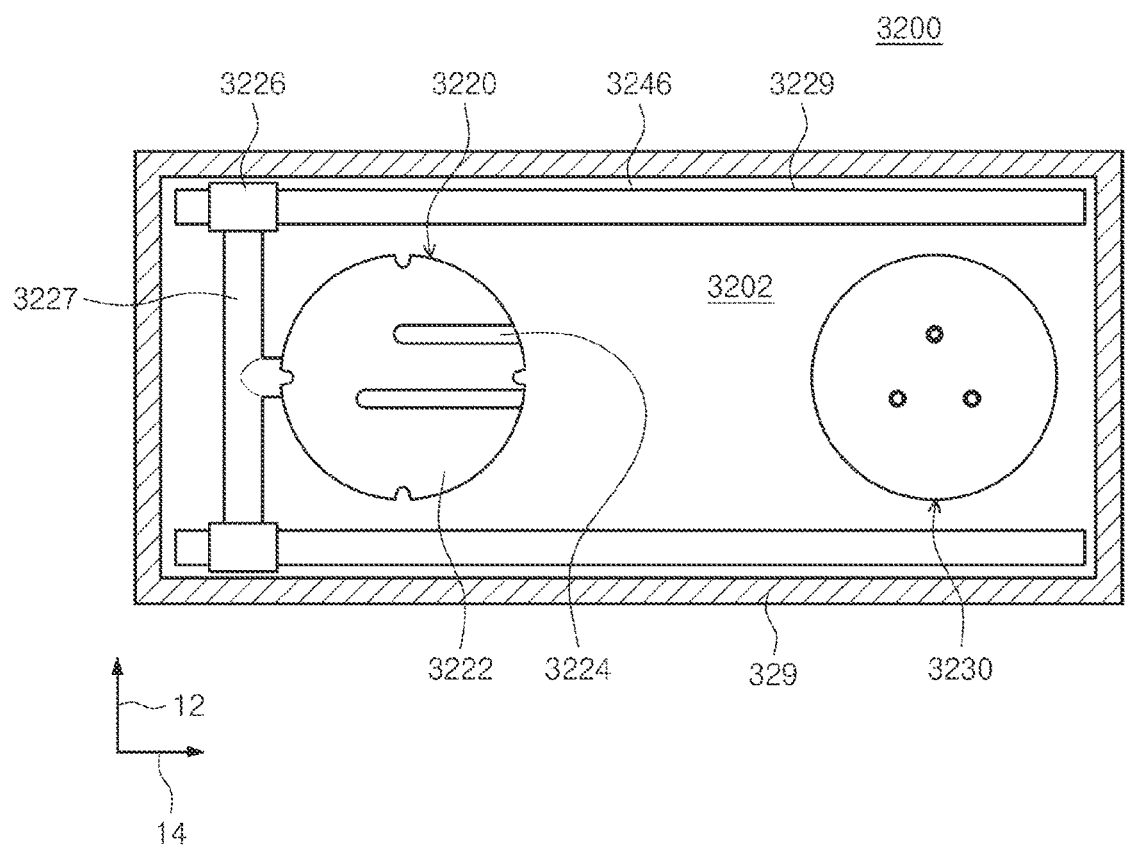
FIG. 5 is a schematic horizontal sectional view illustrating a heat treatment chamber of FIG. 3.
Figure 6:
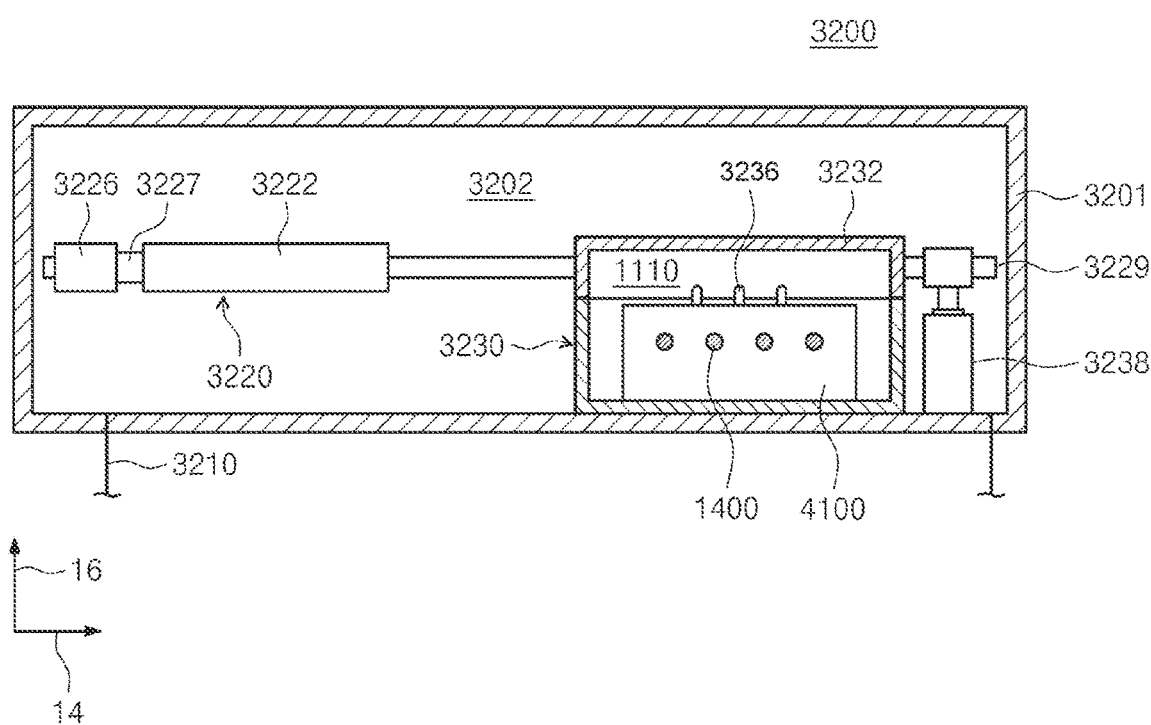
FIG. 6 is a front sectional view illustrating the heat treatment chamber of FIG. 5.

FIG. 5 is a schematic horizontal sectional view illustrating the heat treatment chambers of FIG. 3, and FIG. 6 is a front sectional view of the heat treatment chamber of FIG. 5. The heat treatment chamber 3200 includes a treatment container 3201, a cooling unit 3220, and a heating unit 3230.

The treatment container 3201 has an interior space 3202. The treatment container 3201 has a substantially rectangular parallelepiped shape. The treatment container 3201 has, in a sidewall thereof, an entrance/exit opening (not illustrated) through which the substrate W enters or exits the treatment container 3201. Furthermore, a door (not illustrated) may be provided to open and close the entrance/exit opening. Selectively, the entrance/exit opening may remain open. The entrance/exit opening may be formed in a region adjacent to the cooling unit 3220. The cooling unit 3220, the heating unit 3230, and a measurement unit 3240 are provided in the interior space 3202 of the treatment container 3201. The cooling unit 3220 and the heating unit 3230 are provided side by side along the Y-axis direction 14. An exhaust line 3210 may be connected to the treatment container 3201. The exhaust line 3210 may release, to the outside of the treatment container 3201, a gas supplied by a fan unit 3250. The exhaust line 3210 may be connected to the bottom of the treatment container 3201. Without being limited thereto, however, the exhaust line 3210 may be connected to a side of the treatment container 3201.

The cooling unit 3220 has a cooling plate 3222. The substrate W may be seated on the cooling plate 3222. The cooling plate 3222 may have a substantially circular shape when viewed from above. A cooling member (not illustrated) is provided inside the cooling plate 3222. According to an embodiment, the cooling member may be formed inside the cooling plate 3222 and may serve as a fluid channel through which a cooling fluid flows. Accordingly, the cooling plate 3222 may cool the substrate W. The cooling plate 3222 may have a diameter corresponding to the substrate W. The cooling plate 3222 may have notches formed at the edge thereof. The notches may have a shape corresponding to the support protrusions 3429 formed in the hand A described above. Furthermore, as many notches as the support protrusions 3429, which are formed in the hand A, may be formed in positions corresponding to the support protrusions 3429. When the vertical positions of the hand A and the cooling plate 3222 are changed, the substrate W is transferred between the hand A and the cooling plate 3222. A plurality of guide grooves 3242 in a slit shape are formed in the cooling plate 3222. The guide grooves 3224 extend inward from the edge of the cooling plate 3222. The lengthwise direction of the guide grooves 3224 is parallel to the Y-axis direction 14, and the guide grooves 3224 are located to be spaced apart from each other along the X-axis direction 12. The guide grooves 3224 prevent the cooling plate 3222 and lift pins 1340 from interfering with each other when the substrate W is transferred between the cooling plate 3222 and the heating unit 3230.

The cooling plate 3222 may be supported by a support member 3237. The support member 3237 may include a first support member having a rod shape and a second support member coupled to the center of the first support member. One end and an opposite end of the first support member are coupled with an actuator 3226. The actuator 3226 is mounted on guide rails 3229. When viewed from above, the lengthwise direction of the guide rails 3229 may be parallel to the Y-axis direction 14, and the guide rails 3229 may be provided on opposite sides of the treatment container 3201. The cooling plate 3222 may be moved along the Y-axis direction 14 by the actuator 3226 mounted on the guide rails 3229.

The heating unit 3230 may include a housing 3232, a support plate 4100, a heating member 1400, the lift pins 1340, and a drive member 3238. The housing 3232 may include a body and a cover. The body may be disposed under the cover. The body may have a shape that is open at the top. The body may have a cylindrical shape that is open at the top. The cover may cover the open top of the body. The cover may have a cylindrical shape that is open at the bottom. Alternatively, the cover may have a plate shape that covers the open top of the body. The body and the cover may be combined with each other to form a treatment space 1110. Furthermore, the cover may be connected with the drive member 3238 that moves the cover in an up-down direction. Accordingly, the cover may be moved in the up-down direction to open or close the treatment space 1110. For example, when the substrate W is loaded into or unloaded from the treatment space 1110, the cover may be moved upward to open the treatment space 1110. Furthermore, when the substrate W is treated in the treatment space 1110, the cover may be moved downward to close the treatment space 1110.

The support plate 4100 may support the substrate W in the treatment space 1110. The substrate W may be seated on the support plate 4100. The support plate 4100 has a substantially circular shape when viewed from above. The support plate 4100 has a larger diameter than the substrate W.

The heating member 1400 is provided inside the support plate 4100. In an embodiment, the heating member 1400 is implemented with a heater. The heater may be implemented with a resistance heating element to which electric current is applied. Accordingly, the support plate 4100 may heat the substrate W. The support plate 4100 includes the lift pins 1340 that are vertically movable along the Z-axis direction 16. The lift pins 1340 receive the substrate W from a transfer means outside the heating unit 3230 and lower the substrate W onto the support plate 4100, or raise the substrate W off the support plate 4100 and transfer the substrate W to the transfer means outside the heating unit 3230. According to an embodiment, three lift pins 1340 may be provided.

Figure 7:
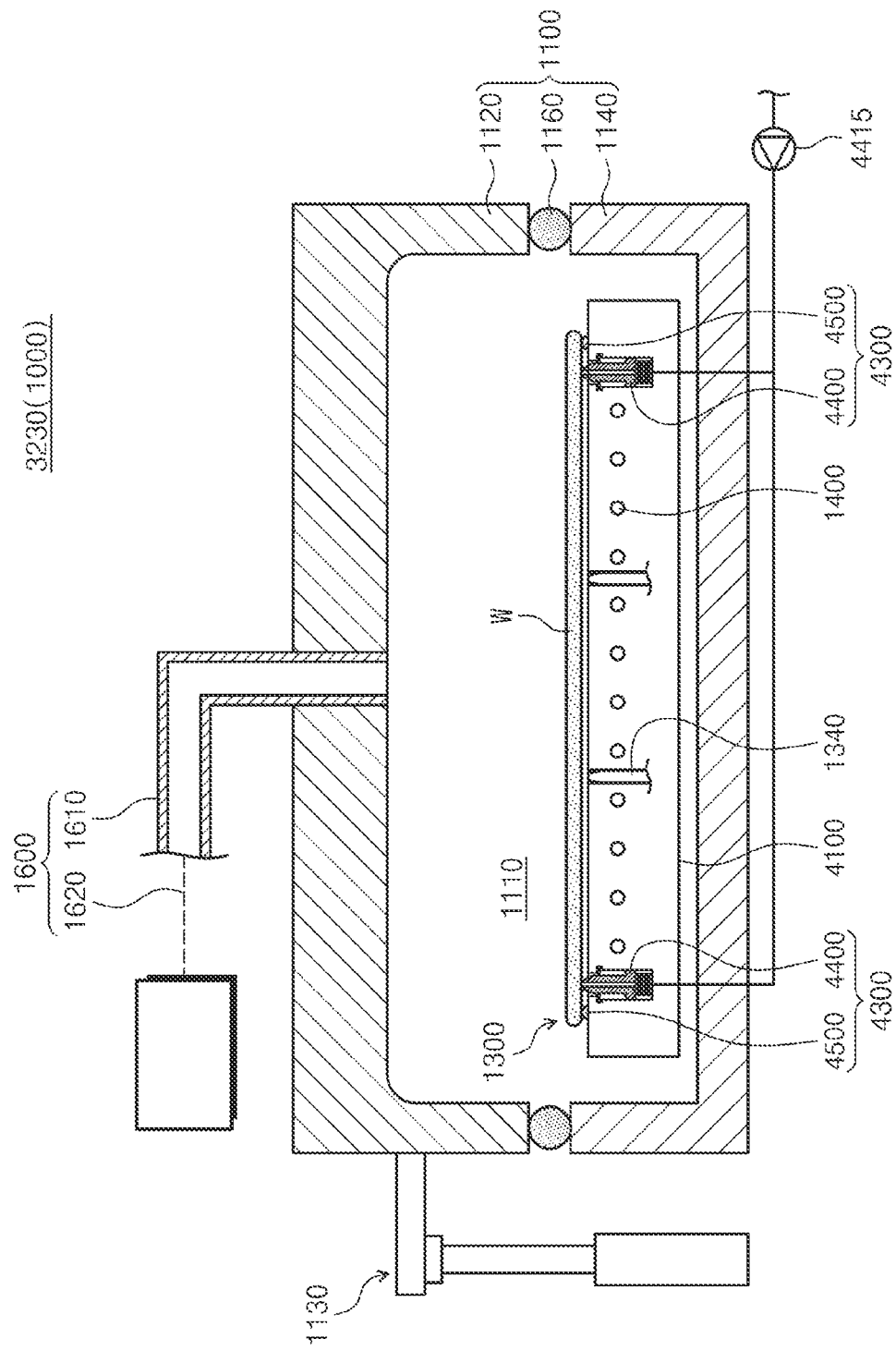
FIG. 7 is a front sectional view illustrating a heating unit of FIG. 6.
Figure 8:
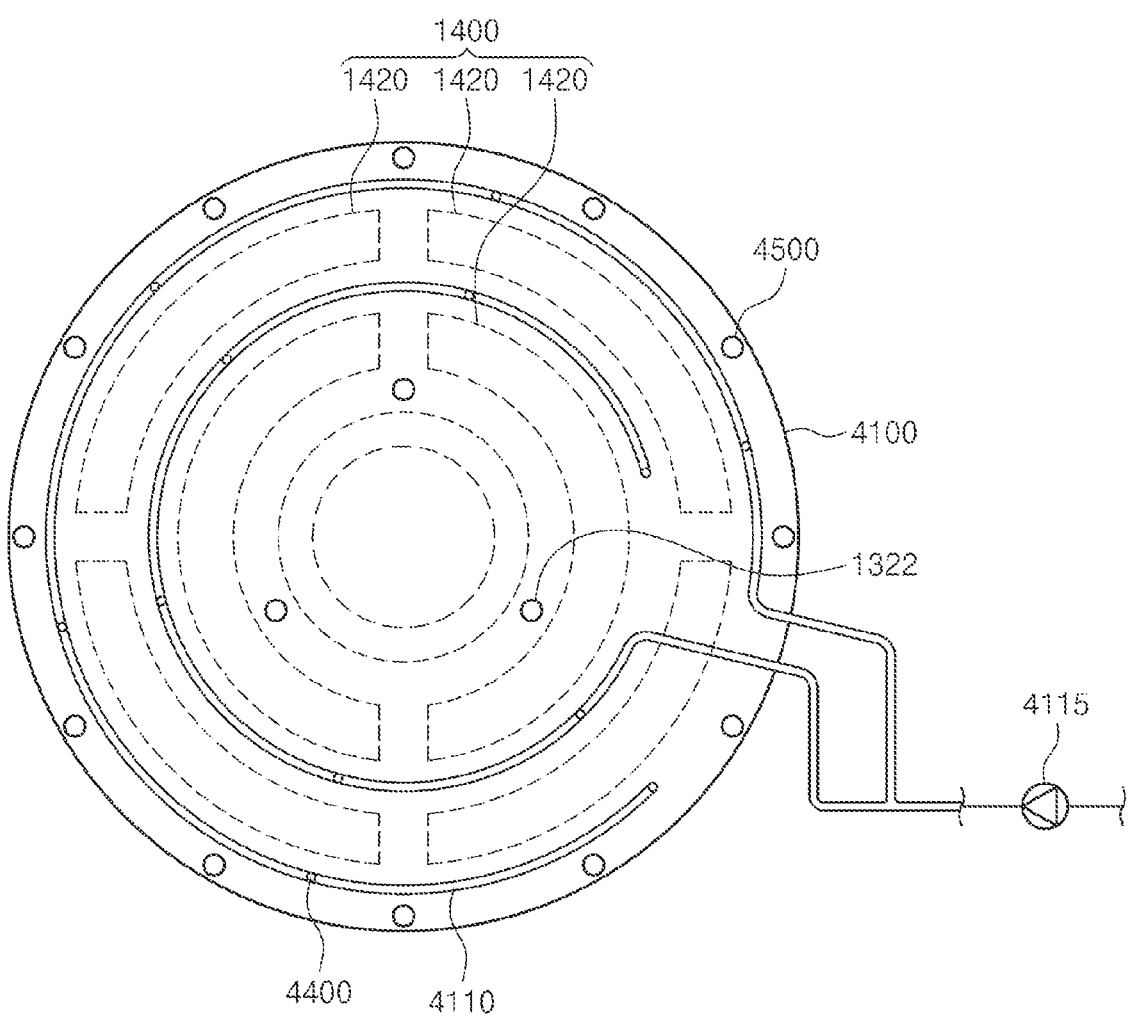
FIG. 8 is a plan view illustrating a support plate of FIG. 7.

FIG. 7 is a front sectional view illustrating the heating unit of FIG. 6, and FIG. 8 is a plan view illustrating a support plate of FIG. 7. Referring to FIGS. 7 and 8, the heating unit 3230 includes a housing 1100, a support unit 1300, and a gas supply unit 1600.

The housing 1100 has a treatment space 1110 therein in which the substrate W is heated. The treatment space 1110 is sealed from the outside. The housing 1100 includes an upper body 1120, a lower body 1140, and a sealing member 1160.

The upper body 1120 has a container shape that is open at the bottom, and the lower body 1140 has a container shape that is open at the top. The lower body 1140 is located under the upper body 1120. The upper body 1120 and the lower body 1140 are located to face each other in the up-down direction. The upper body 1120 and the lower body 1140 are combined with each other to form the treatment space 1110 inside. The upper body 1120 and the lower body 1140 are located such that the central axes thereof are aligned with each other in the up-down direction. The lower body 1140 may have the same diameter as the upper body 1120. That is, an upper end of the lower body 1140 may be located to face a lower end of the upper body 1120.

One of the upper body 1120 and the lower body 1140 is moved to an open position or a closed position by a lifting member 1130, and the other is fixed in position. In this embodiment, it is exemplified that the lower body 1140 is fixed in position and the upper body 1120 is moved. The open position is a position in which the upper body 1120 and the lower body 1140 are spaced apart from each other and therefore the treatment space 1110 is open. The closed position is a position in which the treatment space 1110 is sealed from the outside by the lower body 1140 and the upper body 1120.

The sealing member 1160 is located between the upper body 1120 and the lower body 1140. The sealing member 1160 seals the treatment space 1110 from the outside when the upper body 1120 and the lower body 1140 are brought into contact with each other. The sealing member 1160 may have an annular ring shape. The sealing member 1160 may be fixedly coupled to the upper end of the lower body 1140.

The support unit 1300 supports the substrate W in the treatment space 1110. The support unit 1300 includes a support plate 4100, a heating member 1400, and height adjustment members 4300.

The support plate 4100 may have a substantially circular shape when viewed from above. The support plate 4100 may have a pressure-reducing passage 4110 formed therein. The pressure-reducing passage 4110 may be formed inside the support plate 4100. When viewed from above, the pressure-reducing passage 4110 may be formed between a central region and an edge region of the support plate 4100. In an embodiment, a plurality of pressure-reducing passages 4110 may be formed. The plurality of pressure-reducing passages 4110 may be formed inside the support plate 4100 to form concentric circles with respect to the center of the support plate 4100. Furthermore, the plurality of pressure-reducing passages 4110 may be connected together.

When viewed from above, one end of each of the pressure-reducing passages 4110 is connected with a pressure-reducing member 4115. The pressure-reducing member 4115 may apply reduced pressure to the pressure-reducing passage 4110. The pressure-reducing member 4115 may be connected to the one end of the pressure-reducing passage 4110. The pressure-reducing member 4115 may be a pump. Without being limited thereto, however, the pressure-reducing member 4115 may be implemented with various well-known devices capable of applying reduced pressure to the pressure-reducing passage 4110.

Furthermore, the support plate 4100 includes plungers 4400 and proximity pins 4500. The plungers 4400 and the proximity pins 4500 support the substrate W. The plungers 4400 may be vertically moved by reduced pressure applied by the pressure-reducing passages 4110. The heights of the proximity pins 4500 may be fixed.

The heating member 1400 heats the substrate W placed on the support plate 4100. In an embodiment, the heating member 1400 includes a plurality of concentric heaters 1420 inside the support plate 4100.

The gas supply unit 1600 supplies a gas to the substrate W located in the treatment space 1110. The gas supply unit 1600 includes a gas supply tube 1610 and a gas supply line 1620. The gas supply tube 1610 is connected to the upper body 1120. The gas supply tube 1610 supplies, to the substrate W, the gas delivered from the gas supply line 1620. The gas may be supplied into the treatment space 1110 while the substrate W is heated and may improve adhesion of photoresist to the substrate W.

According to an embodiment, the gas may be a hexamethyldisilazane (HMDS) gas. The HMDS gas may change the property of the substrate W from a hydrophilic property to a hydrophobic property. In an embodiment, the HMDS mixed with a carrier gas may be supplied. In an embodiment, the carrier gas may be an inert gas. For example, the inert gas may be nitrogen gas.

Figure 9:
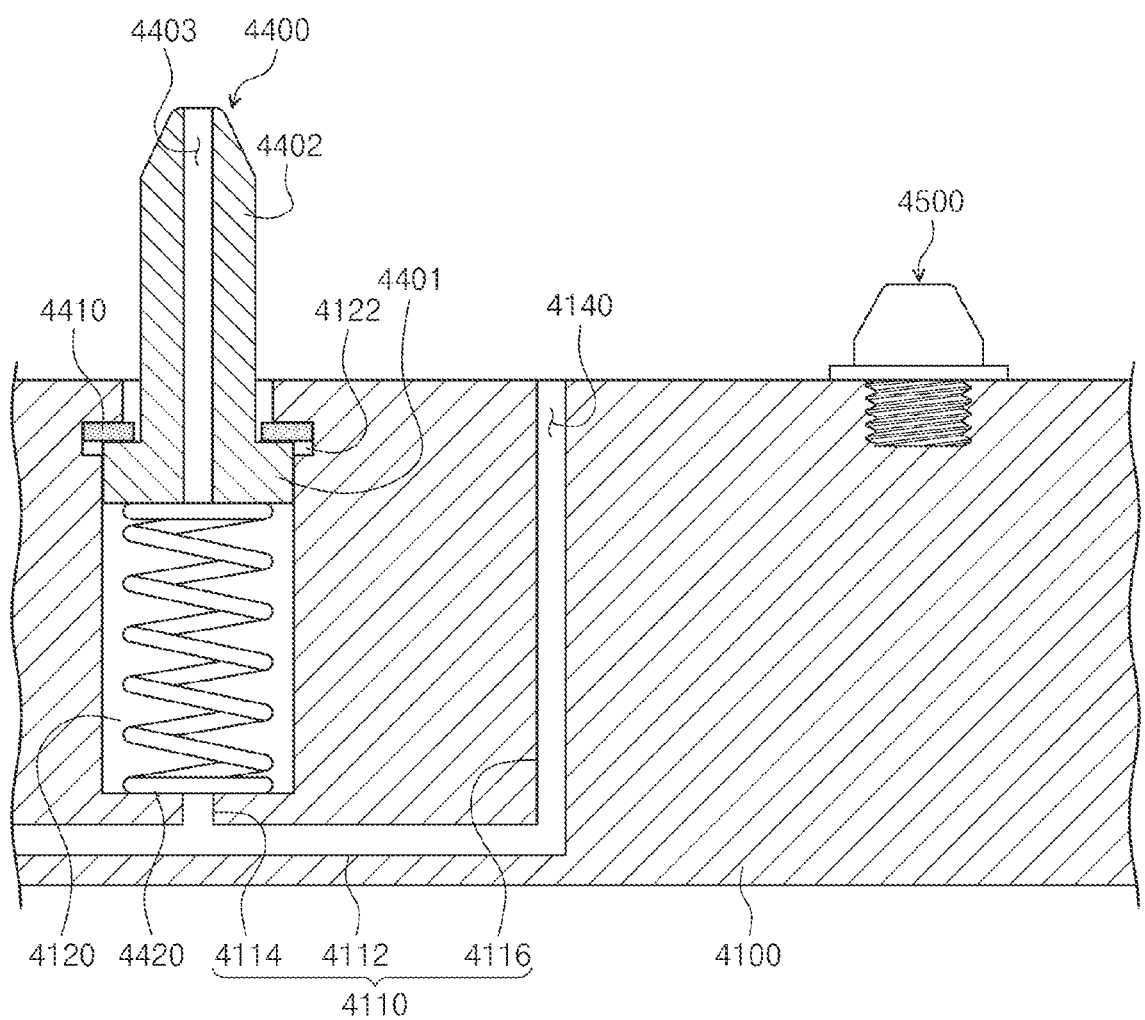
FIGS. 9 to 11 are sectional views illustrating a support unit according to an embodiment of the inventive concept.
Figure 10:
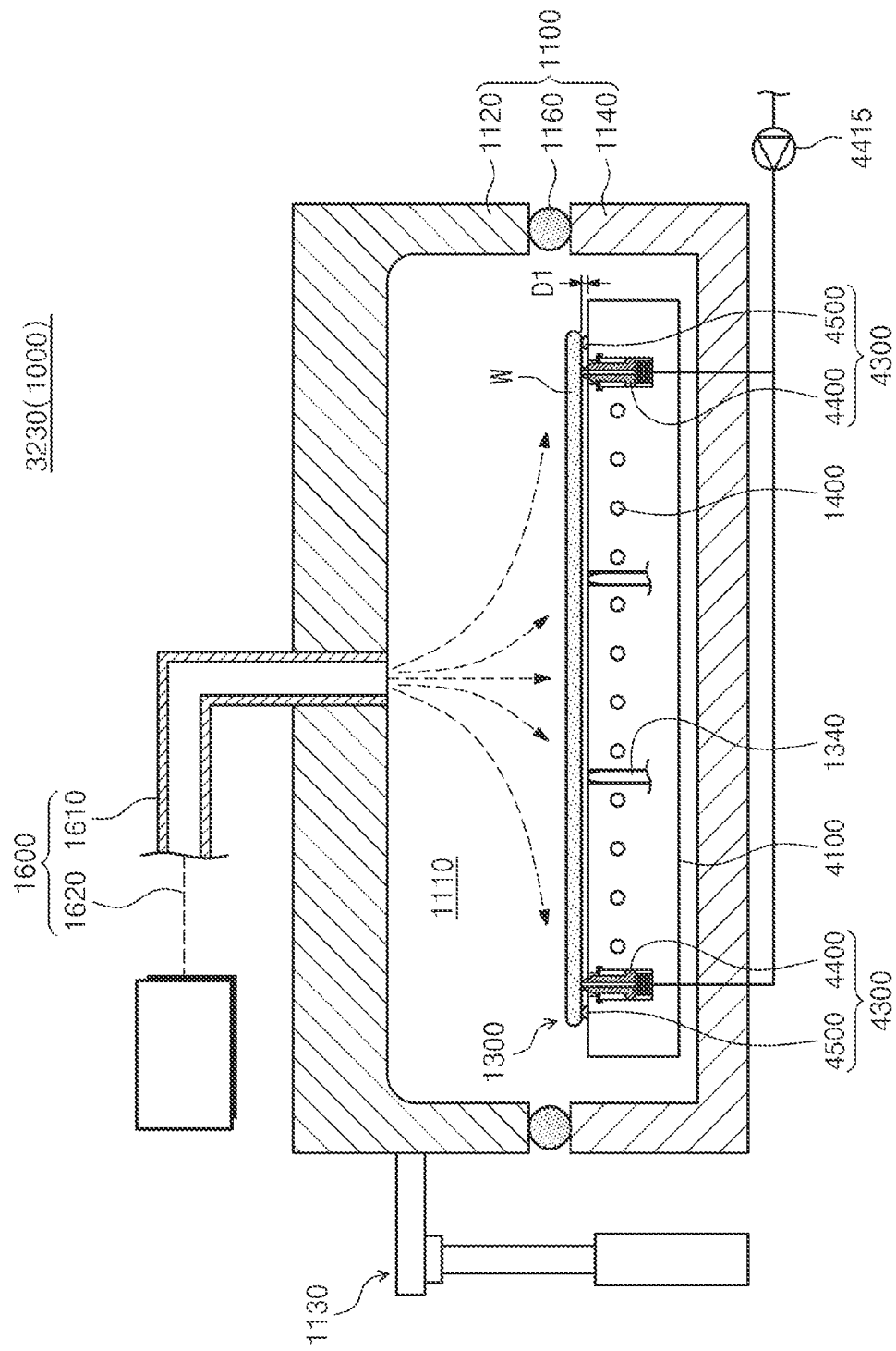
Figure 11:
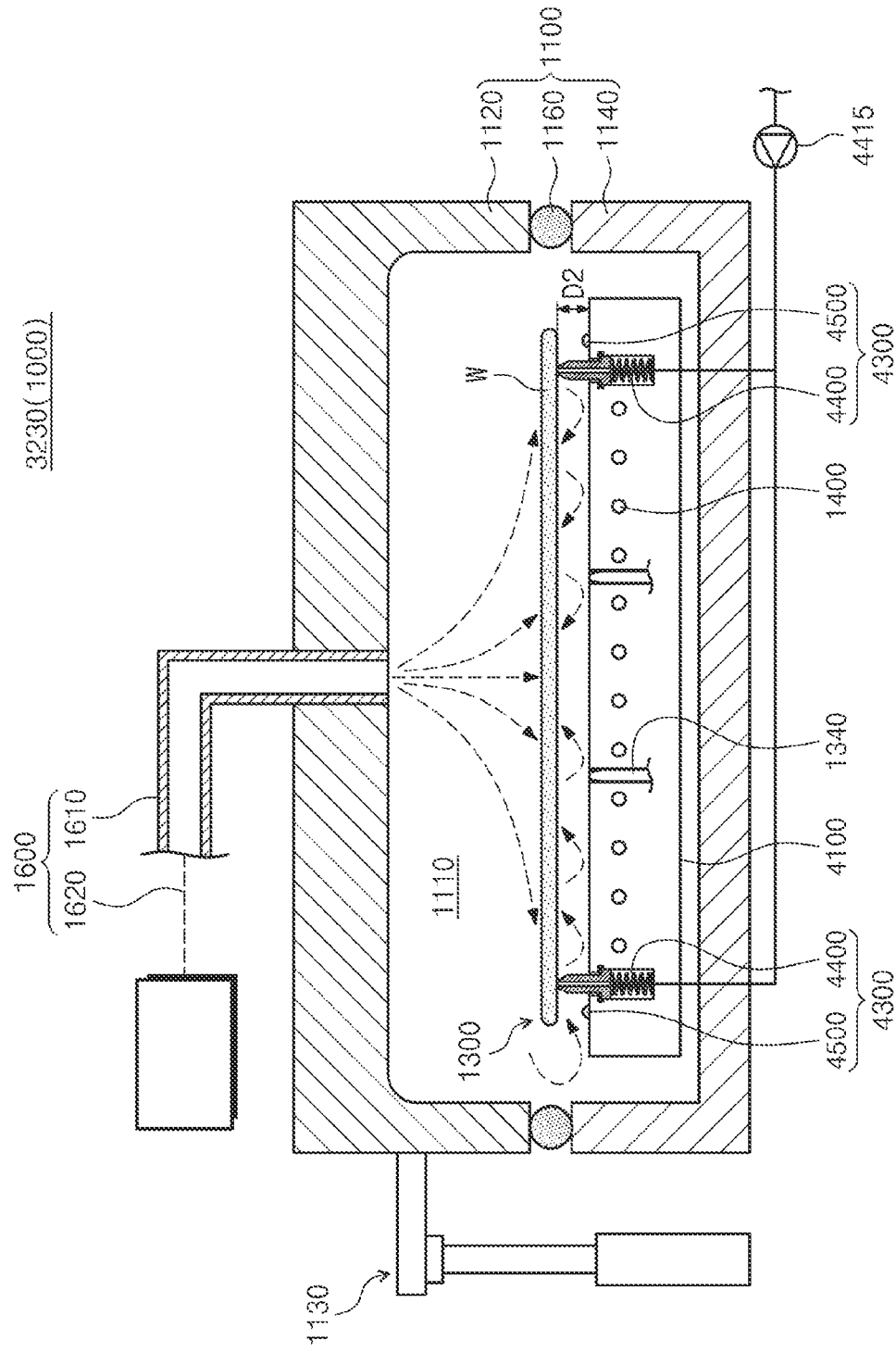

FIGS. 9 to 11 are sectional views illustrating the support unit 1300 according to an embodiment of the inventive concept. Referring to FIG. 9, each of the height adjustment members 4300 includes the plunger 4400 and the proximity pin 4500.

The plunger 4400 is movable in the up-down direction between a protruding position and an insertion position. In the protruding position, the plunger 4400 supports the substrate W. In an embodiment, the protruding position is a height corresponding to a second position. That is, in the second position, the plunger 4400 supports the substrate W. The insertion position is a height lower than or equal to a first position.

In the first position, the proximity pin 4500 supports the substrate W. The proximity pin 4500 has an upper end at a first distance from an upper surface of the support plate 4100. The distance from the upper surface of the support plate 4100 to the upper end of the proximity pin 4500 may be fixed. In an embodiment, the proximity pin 4500 is fixed to the support plate 4100. For example, the proximity pin 4500 may be screw-coupled to the support plate 4100.

A recess 4120 may be formed on the support plate 4100. The plunger 4400 is located in the recess 4120. The recess 4120 may be concavely formed downward from the upper surface of the support plate 4100. In an embodiment, a first stopping end 4122 stepped in a lateral direction of the recess 4120 may be formed in the recess 4120. A second stopping end 4132 stepped in a lateral direction of a second recess 4130 may be formed in the second recess 4130.

The pressure-reducing passage 4110 for reducing the pressure in the recess 4120 is connected to the recess 4120. The pressure-reducing passage 4110 includes a main passage 4112, a first passage, and a second passage 4116. The main passage 4112 is connected with the pressure-reducing member 4115. The first passage 4114 and the second passage 4116 branch off from the main passage 4112. The plunger 4400 is moved from the second position to the first position as the pressure in the pressure-reducing passage 4110 is reduced.

Furthermore, a vacuum hole 4140 may be formed on the support plate 4100. The vacuum hole 4140 may be formed on the upper surface of the support plate 4100. The first passage 4114 of the pressure-reducing passage 4110 described above is connected with the recess 4120. The second passage 4116 extends to the upper surface of the support plate 4100 and forms the vacuum hole 4140.

Hereinafter, the shape of the plunger 4400 will be described in detail.

In an embodiment, the plunger 4400 may have a through-hole 4403 formed therein. The through-hole 4403 may be vertically formed through the plunger 4400. The through-hole 4403 may connect to the pressure-reducing passage 4110. The through-hole 4403 may connect to the first passage 4114. A region under the plunger 4400 in the recess 4120 is connected with the pressure-reducing passage 4110.

In an embodiment, the plunger 4400 may include a first body 4401 and a second body 4402. When viewed from above, the second body 4402 may have a smaller area than the first body 4401. The second body 4402 may extend upward from an upper surface of the first body 4401. In an embodiment, the first body 4401 and the second body 4402 may have a cylindrical shape.

In an embodiment, an upper end of the second body 4402 may have a rounded shape. Accordingly, a scratch on the lower surface of the substrate W may be minimized when the substrate W is seated on the plunger 4400.

The plunger 4400 may be formed of a material containing a synthetic resin or ceramic ($A_2O_3$). In an embodiment, the synthetic resin may be a polyeheretherketone (PeeK) resin. For example, the synthetic resin may be a polybenzimidazol (PBI) resin.

A first stopping member 4410 may be provided between the upper surface of the first body 4401 and the first stopping end 4122 in the recess 4120. In an embodiment, the first stopping member 4410 may have a ring shape. The first stopping member 4410 may have a ring shape with an opening at one side. For example, the first stopping member 4410 may be a C-ring. The first stopping member 4410 may be provided between the first stopping end 4412 and the upper surface of the first body 4401 and may prevent an escape of the plunger 4400 when the plunger 4400 moves upward and downward. In a case where the plunger 4400 needs to be replaced due to continued use of the plunger 4400, the plunger 4400 is moved downward, the first stopping member 4410 is removed, and the plunger 4400 is separated from the recess 4120.

An elastic member 4420 may be provided on a lower surface of the first body 4401. The elastic member 4420 may be disposed in the recess 4120. In an embodiment, the elastic member 4420 may be a spring. An upper end of the elastic member 4420 may be connected with the lower surface of the first body 4401, and a lower end of the elastic member 4420 may be connected to a lower surface of the recess 4120. Accordingly, the elastic member 4420 may move the plunger 4400 in the up-down direction.

For example, when reduced pressure is applied to the pressure-reducing passage 4110, the reduced pressure is applied to the recess 4120 connected with the pressure-reducing passage 4110. The plunger 440 may be moved downward by the reduced pressure applied by the pressure-reducing passage 4110. Furthermore, when the application of the reduced pressure to the pressure-reducing passage 4110 is stopped, the application of the reduced pressure to the recess 4120 connected with the pressure-reducing passage 4110 is also stopped. The plunger 4400 may be moved upward by the elastic force of the elastic member 4420.

Hereinafter, a substrate treating method of the inventive concept will be described with reference to FIGS. 10 and 11.

When the substrate W is seated on the support unit 1300 and a hydrophobic gas is introduced into the treatment space 1110, a hydrophobization process for the substrate W starts. In the hydrophobization process, both the upper surface and the lower surface of the substrate W are hydrophobicized.

The upper surface and the lower surface of the substrate W may be treated irrespective of order. For example, the substrate W may be located in one of the first position and the second position, and one of the upper surface and the lower surface of the substrate W may be hydrophobicized. Thereafter, the substrate W may be located in the other position, and the other surface of the substrate W may be hydrophobicized. In an embodiment, the first position is a position spaced apart upward from the support plate 4100 by a first distance D1, and the second position is a position spaced apart upward from the support plate 4100 by a second distance D2.

In an embodiment, when the hydrophobic gas is supplied into the treatment space 1110, the substrate W is located in the first position for about 15 seconds and thereafter located in the second position. The substrate W stays in the second position while the entire lower surface of the substrate W is hydrophobicized.

Referring to FIG. 10, the hydrophobic gas is introduced into the treatment space 1110, and the substrate W is located in the first position from the upper surface of the support plate 4100. As the proximity pins 4500 are fixed, the substrate W maintains a uniform interval from the heaters 1420. Accordingly, the temperature of the substrate W is uniformly raised. When the substrate W is located in the first position, reduced pressure is applied to the pressure-reducing passages 4110. The reduced pressure applied by the pressure-reducing passages 4110 is delivered to the recesses 4120. Accordingly, the plungers 4400 are moved downward, and the distance between the support plate 4100 and the substrate W is decreased. The proximity pins 4500 allow the substrate W to remain at the first distance D1 above the support plate 4100 without moving toward the support plate 4100.

Furthermore, the reduced pressure applied by the pressure-reducing passages 4110 is also delivered to the through-holes 4403 of the plungers 4400. Accordingly, the substrate W may be clamped onto the plungers 4400 by the reduced pressure in the through-holes 4403. Also, the reduced pressure applied by the pressure-reducing passages 4110 is delivered to the vacuum holes 4140. Accordingly, the substrate W may be stably seated on the support unit 1300.

Referring to FIG. 11, the substrate W is located in the second position spaced apart from the upper surface of the support plate 4100 by the second distance D2. As the gas supply unit 1600 supplies the hydrophobic gas from above the substrate W and the substrate W is located close to the support plate 4100, the upper surface of the substrate W is easy to hydrophobicize, but the lower surface of the substrate W is relatively difficult to hydrophobicize. Accordingly, in the inventive concept, the substrate W is located in the second position to enable the lower surface of the substrate W to be hydrophobicized.

When the application of the reduced pressure to the pressure-reducing passages 4110 is stopped, the plungers 4400 may be moved upward by elastic forces of the elastic members 4420. Accordingly, the substrate W supported on the plungers 4400 may be moved upward. In an embodiment, the application of the reduced pressure to the pressure-reducing passages 4110 is stopped to move the substrate W to the second position. Accordingly, the plungers 4400 are moved upward. As the plungers 4400 are moved upward, the substrate W may be moved in a direction away from the support plate 4100. In an embodiment, the elastic members 4420 cause the plungers 4400 to apply forces to the lower surface of the substrate W in the upward direction.

Furthermore, the plungers 4400 are upwardly forced due to a pressure difference between above and below the substrate W. When there is a significant difference in pressure between above and below the substrate W, the plungers 4400 may slowly move upward as the resistances applied to the elastic members 4420 increase. Accordingly, a squeeze effect by which the substrate W, when raised, bounces up and is damaged may be removed.

In a case where the through-holes 4403 are not formed in the plungers 4400, the second passages 4116 and the vacuum holes 4140 have to be formed adjacent to the plungers 4400. Otherwise, the points where the reduced pressure is applied are distant from the points that the plungers 4400 support. In this case, the substrate W may be warped by the pressures applied from the vacuum holes 4140. Furthermore, loads may be applied to the plungers 4400.

Figure 12:
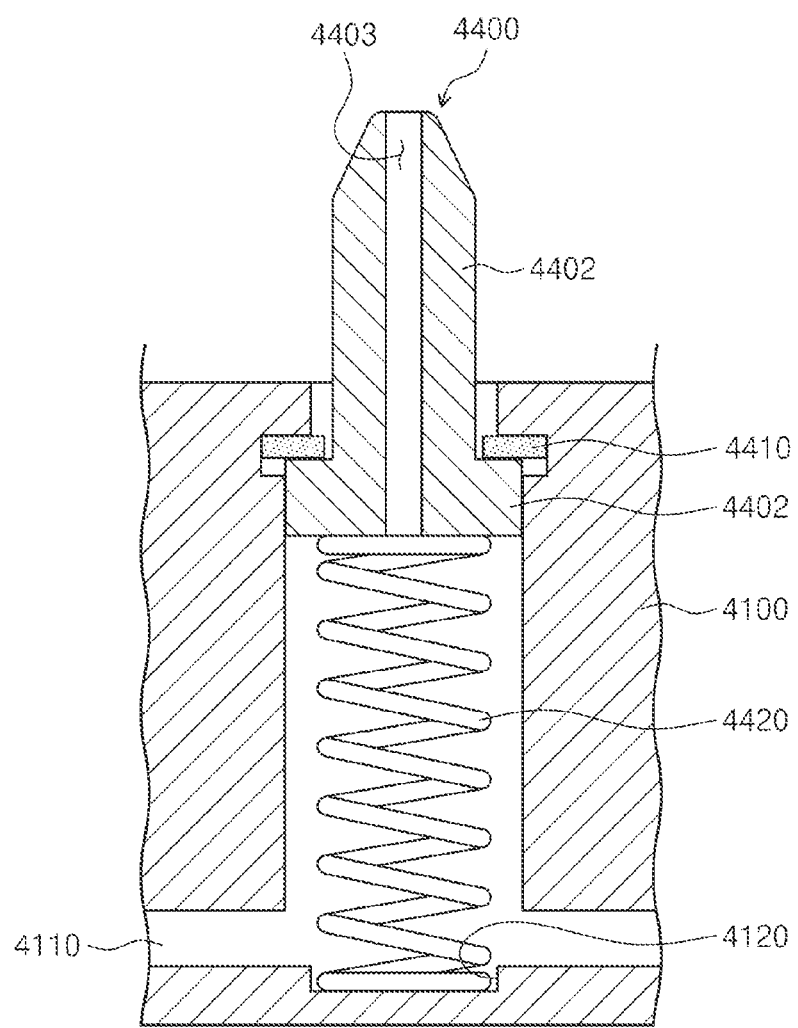
FIGS. 12 to 14 are sectional views illustrating plungers according to other embodiments of the inventive concept.

However, according to an embodiment of the inventive concept, the plungers 4400 have the through-holes 4403 formed therein. Accordingly, the plungers 4400 may attract the lower surface of the substrate W. As the plungers 4400 clamp the substrate W, the positions of the second passages 4116 may be freely changed as illustrated in FIG. 12.

In a case where a warped substrate W is seated on the support unit 1300, it may be difficult to appropriately position the substrate W with only the plungers 4400. The second passages 4116 and the vacuum holes 4140 may apply reduced pressure to the lower surface of the substrate W to appropriately position the warped substrate W. That is, the second passages 4116 and the vacuum holes 4140 may complement clamping of the substrate W by the plungers 4400.

Figure 13:
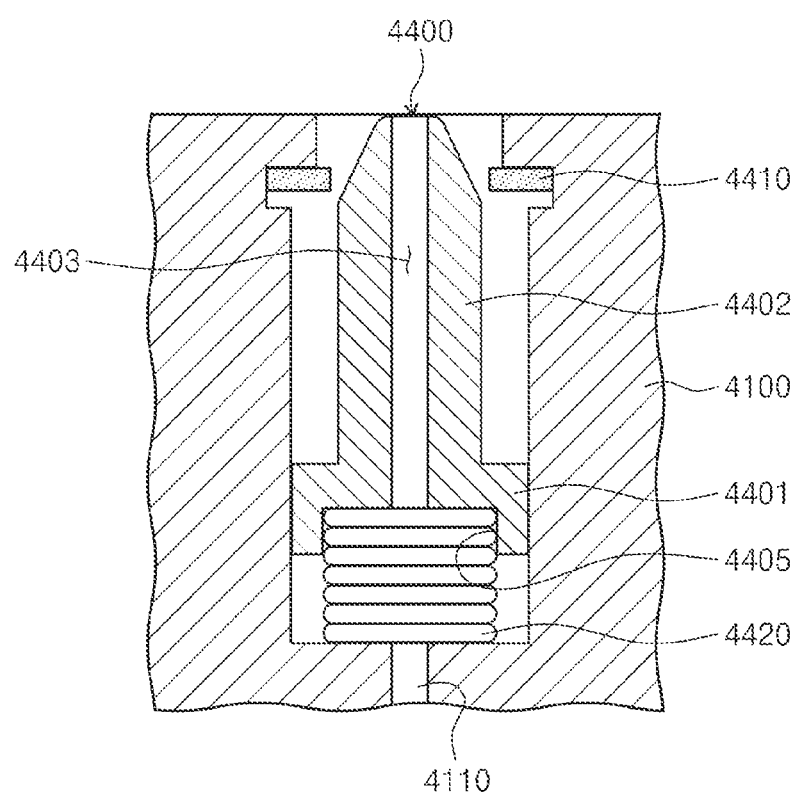

In the above-described embodiments, it has been described that the insertion position of the plunger 4400 corresponds to the first position. However, as illustrated in FIG. 13, the insertion position of the plunger 4400 may be a position in which the second body 4402 is completely inserted into the recess 4120.

Figure 14:
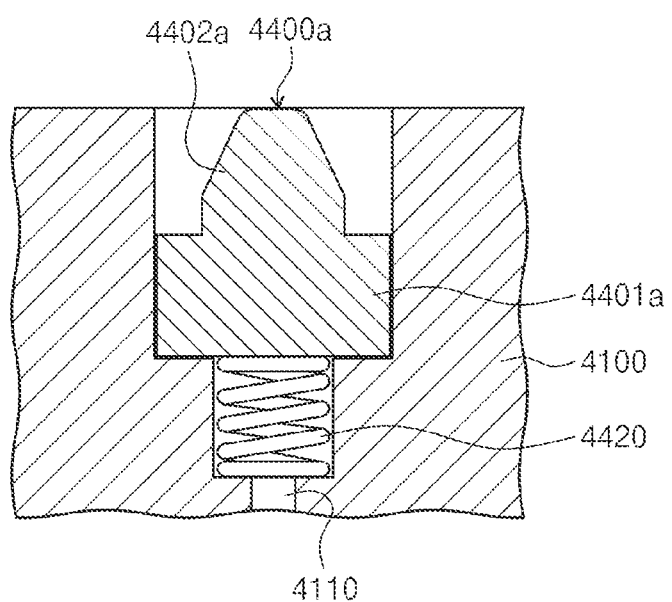

In the above-described embodiments, it has been described that the plunger 4400 has the through-hole 4403 formed therein. However, as illustrated in FIG. 14, a plunger 4400a may have a first body 4401a and a second body 4402 that have no hole formed therein. The plunger 4400a may be moved downward by reduced pressure applied to the recess 4120 and may be moved upward by the elastic force of the elastic member 4420.

Referring again to FIGS. 1 to 3, each of the developing blocks 30b has heat treatment chambers 3200, a transfer chamber 3400, and liquid treatment chambers 3600. The heat treatment chambers 3200, the transfer chamber 3400, and the liquid treatment chambers 3600 of the developing block 30b are provided in a structure and an arrangement substantially similar to the structure and the arrangement in which the heat treatment chambers 3200, the transfer chamber 3400, and the liquid treatment chambers 3600 of the coating block 30a are provided. Therefore, descriptions thereabout will be omitted. However, the liquid treatment chambers 3600 in the developing block 30b are provided as developing chambers 3600, all of which identically perform a developing process on the substrate W by dispensing a developing solution onto the substrate W.

The interface module 40 connects the treating module 30 with an external exposing apparatus 50. The interface module 40 has an interface frame 4100, an additional process chamber 4200, an interface buffer 4400, and a transfer member 4600.

The interface frame 4100 may have, at the top thereof, a fan filter unit that forms a downward air flow in the interface frame 4100. The additional process chamber 4200, the interface buffer 4400, and the transfer member 4600 are disposed in the interface frame 4100. Before the substrate W completely treated in the coating block 30a is transferred to the exposing apparatus 50, the additional process chamber 4200 may perform a predetermined additional process on the substrate W. Selectively, before the substrate W completely treated in the exposing apparatus 50 is transferred to the developing block 30b, the additional process chamber 4200 may perform a predetermined additional process on the substrate W. According to an embodiment, the additional process may be an edge exposing process of exposing the edge region of the substrate W to light, a top-side cleaning process of cleaning the top side of the substrate W, or a backside cleaning process of cleaning the backside of the substrate W. A plurality of additional process chambers 4200 may be provided. The additional process chambers 4200 may be stacked one above another. The additional process chambers 4200 may all perform the same process. Selectively, some of the additional process chambers 4200 may perform different processes.

The interface buffer 4400 provides a space in which the substrate W transferred between the coating block 30a, the additional process chambers 4200, the exposing apparatus 50, and the developing block 30b temporarily stays. A plurality of interface buffers 4400 may be provided. The interface buffers 4400 may be stacked one above another.

According to an embodiment, the additional process chambers 4200 may be disposed on one side of an extension line facing in the lengthwise direction of the transfer chamber 3400, and the interface buffers 4400 may be disposed on an opposite side of the extension line.

The transfer member 4600 transfers the substrate W between the coating block 30a, the additional process chambers 4200, the exposing apparatus 50, and the developing block 30b. The transfer member 4600 may be implemented with one or more robots. According to an embodiment, the transfer member 4600 has a first robot 4602 and a second robot 4606. The first robot 4602 may transfer the substrate W between the coating block 30a, the additional process chambers 4200, and the interface buffers 4400. An interface robot 4604 may transfer the substrate W between the interface buffers 4400 and the exposing apparatus 50. The second robot 4606 may transfer the substrate W between the interface buffers 4400 and the developing block 30b.

Each of the first robot 4602 and the second robot 4606 includes a hand on which the substrate W is placed, and the hand is movable forward and backward, rotatable about an axis parallel to the Z-axis direction 16, and movable along the Z-axis direction 16.

As described above, according to the embodiments, the inventive concept has an advantage of hydrophobicizing an upper surface and a lower surface of a substrate.

Furthermore, according to the embodiments, the inventive concept has an advantage of minimizing a squeeze effect occurring while a substrate is subjected to heat treatment.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a housing having a treatment space inside;
    a gas supply unit configured to supply a hydrophobic gas into the treatment space to hydrophobicize the substrate; and
    a support unit configured to support the substrate in the treatment space,
    wherein the support unit includes:
    a support plate;
    a heater configured to heat the substrate on the support plate;
    a height adjustor configured to change a position of the substrate between a first position spaced apart upward from an upper surface of the support plate by a first distance and a second position spaced apart upward from the upper surface of the support plate by a second distance,
    wherein the height adjustor is in a recess formed below the upper surface of the support plate; and
    a pressure-reducing passage connected to the recess, the pressure-reducing passage configured to reduce pressure in the recess,
    wherein the height adjustor includes a through-hole vertically through the height adjustor and confined within the height adjustor, the through-hole connected with the pressure-reducing passage, and
    wherein the second position is a higher position than the first position.

2. The apparatus of claim 1, wherein the height adjustor includes a plunger configured to be movable in an up-down direction between a protruding position and an insertion position and to support the substrate in the protruding position,
    wherein the insertion position is a height equal to or lower than the first position, and
    wherein the protruding position is a height corresponding to the second position.

3. The apparatus of claim 2, wherein the height adjustor further includes a proximity pin having an upper end at the first distance from the upper surface of the support plate.

4. The apparatus of claim 3, wherein the proximity pin is fixed to the support unit.

5. The apparatus of claim 2, wherein the plunger is configured to be moved from the second position to the first position as pressure in the pressure-reducing passage is reduced.

6. The apparatus of claim 2, wherein the plunger includes:
    a first body; and
    a second body extending upward from the first body, wherein the second body has a smaller area than the first body when viewed from above, wherein in the protruding position, the first body is in the recess, and wherein in the protruding position, the second body supports the substrate.

7. The apparatus of claim 6, wherein an elastic member is on a lower surface of the first body, and wherein one side of the elastic member is connected with the lower surface of the first body, and an opposite side of the elastic member is connected with the support plate.

8. The apparatus of claim 2, wherein the pressure-reducing passage includes:

a main passage; and a first passage and a second passage configured to branch off from the main passage, wherein the first passage is connected with the recess, and wherein the second passage extends to the upper surface of the support plate.

9. The apparatus of claim 2, wherein the plunger includes a plurality of plungers arranged in a circumferential direction of the support plate.

10. The apparatus of claim 2, wherein the hydrophobic gas is a hexamethyldisilazane (HMDS) gas.

11. A support unit for supporting a substrate in a treatment space, the support unit comprising:

a support plate;

a heater configured to heat the substrate on the support plate;

a height adjustor configured to change a position of the substrate between a first position spaced apart upward from an upper surface of the support plate by a first distance and a second position spaced apart upward from the upper surface of the support plate by a second distance, wherein the height adjustor is in a recess formed below the upper surface of the support plate; and a pressure-reducing passage connected to the recess, the pressure-reducing passage configured to reduce pressure in the recess, wherein the height adjustor includes a through-hole vertically through the height adjustor and confined within the height adjustor, the through-hole connected with the pressure-reducing passage, and wherein the second distance is greater than the first distance.

12. The support unit of claim 11, wherein the height adjustor includes a plunger configured to support the substrate in the second position, and wherein the plunger is movable between the first position and the second position.

13. The support unit of claim 11, wherein the height adjustor includes a proximity pin having an upper end at the first distance from the upper surface of the support plate.

14. The support unit of claim 12, wherein the plunger is configured to be moved from the second position to the first position as pressure in the pressure-reducing passage is reduced.

15. The support unit of claim 12, wherein an elastic member is on a lower surface of the plunger, and wherein one side of the elastic member is connected with the lower surface of the plunger, and an opposite side of the elastic member is connected with the support plate.

* * * * *